United States Patent
Choi et al.

(10) Patent No.: US 8,994,586 B1
(45) Date of Patent: Mar. 31, 2015

(54) APPARATUS AND METHOD FOR DETECTING TARGET IN NEAR FIELD

(71) Applicant: Agency for Defense Development, Daejeon (KR)

(72) Inventors: Jae-Hyun Choi, Daejeon (KR); Myung-Suk Jung, Daejeon (KR); Won-Young Uhm, Daejeon (KR); Wan-Joo Kim, Daejeon (KR)

(73) Assignee: Agency for Defense Development, Daejeon (KR)

( * ) Notice: Subject to any disclaimer, the term of this patent is extended or adjusted under 35 U.S.C. 154(b) by 0 days.

(21) Appl. No.: 14/092,610

(22) Filed: Nov. 27, 2013

(51) Int. Cl.
*G01S 7/35* (2006.01)
*G01S 13/34* (2006.01)
*G01S 13/58* (2006.01)
*G01S 7/41* (2006.01)

(52) U.S. Cl.
CPC . *G01S 7/35* (2013.01); *G01S 13/34* (2013.01); *G01S 13/584* (2013.01); *G01S 7/414* (2013.01); *H03F 2200/447* (2013.01)
USPC ............................ 342/200; 342/109; 342/128

(58) Field of Classification Search
CPC ........... G01S 7/35; G01S 13/34; G01S 7/414; G01S 13/584; H03F 2200/447
USPC .................................................. 342/128, 200
See application file for complete search history.

(56) References Cited

U.S. PATENT DOCUMENTS

| | | | | |
|---|---|---|---|---|
| 4,306,236 A | * | 12/1981 | Johnson | 342/128 |
| 4,825,214 A | * | 4/1989 | Dejaegher | 342/128 |
| 4,912,472 A | * | 3/1990 | Reits | 342/128 |
| 6,091,942 A | * | 7/2000 | Buer et al. | 455/234.1 |
| 6,384,770 B1 | * | 5/2002 | de Gouy et al. | 342/120 |
| 7,161,527 B2 | * | 1/2007 | Vacanti | 342/121 |
| 7,161,530 B2 | * | 1/2007 | Christian et al. | 342/174 |
| 7,239,266 B2 | * | 7/2007 | Vacanti | 342/120 |
| 8,248,298 B2 | * | 8/2012 | Lalezari | 342/179 |
| 2008/0100510 A1 | * | 5/2008 | Bonthron et al. | 342/373 |
| 2011/0181458 A1 | * | 7/2011 | Feil | 342/124 |
| 2013/0169468 A1 | * | 7/2013 | Johnson et al. | 342/41 |

FOREIGN PATENT DOCUMENTS

| | | |
|---|---|---|
| JP | 1999-101867 A | 4/1999 |
| JP | 2003-172776 A | 6/2003 |
| JP | 2007-298317 A | 11/2007 |
| JP | 2010-101890 A | 5/2010 |
| KR | 10-1239166 B1 | 3/2013 |

* cited by examiner

*Primary Examiner* — Matthew M Barker
(74) *Attorney, Agent, or Firm* — LRK Patent Law Firm

(57) ABSTRACT

An apparatus for detecting a target in near field in accordance with an exemplary embodiment of the present invention includes: an RF transceiver configured to generate a transmitting signal of a frequency modulated continuous wave (FMCW) and delay the signal as much as a desired time; a transmitting and receiving antenna unit configured to transmit and receive the a transmitting signal and the received signal; and a signal processing unit configured to extract a range or a velocity of the target from the signal provided from the RF transceiver.

13 Claims, 8 Drawing Sheets

APPARATUS AND METHOD FOR DETECTING TARGET IN NEAR FIELD

BACKGROUND OF THE INVENTION

1. Field of the Invention

Exemplary embodiments of the present invention relate to radar, and, particularly, to an apparatus and a method for detecting a target in near field to measure a range and a relative velocity of a target in near field using a microwave or a millimeter wave having a frequency modulated continuous waveform.

2. Description of Related Art

When a target of which the relative velocity is Mach x.0 to Mach y.0 and the radar cross section (RCS) is equal to or more than −00 dBsm encounters with a target detecting device (TDD), the target detecting device (TDD) needs to detect the target and generate a detonation signal and needs to generate the detonation signal by a self-destruct (SD/ED) signal which is generated only if a missile is abnormally operated.

To this end, the TDD is largely configured to include a transceiver, an antenna unit, and a signal processing unit, and uses x pairs of transmitting and receiving antennas on a surface of a projectile in a circumferential direction to transmit and receive electromagnetic waves and when a target is present in near field, allows the signal processing unit to analyze the received signals from the antennas so as to detect the target.

Comparing a binary phase shift keying (BPSK) modulation scheme to a frequency modulated continuous wave (FMCW) modulation scheme in order to detect the target in near field under the situation in which a sea clutter having the RCS relatively larger than that of the target is present, since the FMCW modulation scheme has a relatively larger range rejection level to remove the unwanted sea clutter out of a range and easily acquires various types of information on the target, the FMCW modulation scheme is used.

Generally, since a frequency modulated continuous wave (FMCW) proximity sensor radar requires relatively low power, a small detection bandwidth, and the like, the FMCW radar may be miniaturized, used in near field (tens of m to hundreds of m), have high range resolution, and the like.

In particular, since a millimeter wave sensor may be small and lightweight and have high resolution and accuracy, the millimeter wave sensor is used to measure a range and/or a velocity, such as autonomous intelligent cruise control (AICC), industrial level gauge, imaging, and indoor presence detection.

To detect the target in near field under the situation in which the sea clutter having the large RCS is present, the received power ($P_{r-target}$) of the target and the received power ($P_{r-clutter}$) of the sea clutter are calculated depending on a radar Equation and are compared with each other.

$$P_{r-target} = \frac{P_t G_t G_r \lambda^2 \sigma}{4 \pi^3 R^4} \quad \text{Equation 1}$$

$$P_{r-target} = \frac{P_t G_t G_r \lambda^2 \sigma_0 \theta_B \phi_B \csc(\Psi)}{256 \pi^2 R^2} \eta \quad \text{Equation 2}$$

In Equations 1 and 2, $P_r$: received power, $G_t$: transmitting antenna gain, $G_r$: receiving antenna gain, $\lambda$: wavelength, $\sigma$: target RCS, $\sigma_0$: clutter RCS per unit area, ($\theta_B$, $\phi_B$): antenna beam width, $\psi$: Grazing angle, R: range, $\eta$: antenna overlap ratio.

FIG. 1 illustrates the received power of the target and the received power of the sea clutter which are calculated. In Xm or more, when the RCS of the sea clutter is equal to or more than $\sigma_0 = -00$ dB, it may be appreciated that the received power of the sea clutter is larger than that of the target at all times. Therefore, the range rejection level to remove the unwanted clutter out of the range is, an important factor for selecting a transceiver type and requires the rejection of 30 dB or more.

Further, referring to FIG. 2, the FMCW modulation scheme performs frequency modulation on a continuous wave signal to extract an intermediate frequency $f_{if}$ (Hz) which is a difference frequency ($|f_t-f_r|$) between a signal $f_t$ (Hz) 210 transmitted to the target and a received signal $f_r$ (Hz) 220 received by being reflected from the target, thereby measuring the range and the velocity of the target. The transmitted signal of FIG. 1 is modulated into a triangular wave and has a period $T_m$ (sec) and a frequency modulation bandwidth $\Delta F$ (Hz).

The received signal is delayed as much as a delay time $\tau=2R/C$ (sec) corresponding to a range R(m) propagated after being reflected from the target and suffers from Doppler shift $f_d=2V_r/\lambda$ as much as the relative velocity $V_r$ to the target. Therefore, the intermediate frequency $f_{if}$(Hz) is calculated depending on the following Equations 3 and 4.

$$f_{if-upsweep} = f_b - f_d = \frac{4\Delta E f_m R}{C} - \frac{2V_r}{\lambda} \quad \text{Equation 3}$$

$$f_{if-downsweep} = f_b + f_d = \frac{4\Delta E f_m R}{C} + \frac{2V_r}{\lambda} \quad \text{Equation 4}$$

In Equations 3 and 4, $f_m$ is a modulation frequency, C is a propagation velocity on a free space, and $\lambda$ is a signal wavelength. $f_b$ is proportional to the range R and $f_d$ is proportional to the relative velocity $V_r$.

A beat signal $f_b$ (Hz) and a Doppler frequency $f_d$ (Hz) from the above Equations 3 and 4 may be calculated depending on the following Equations 5 and 6.

$$f_b = \frac{f_{if-upsweep} + f_{if-downsweep}}{2} = \frac{4\Delta F f_m R}{C} \quad \text{Equation 5}$$

$$f_d = \frac{f_{if-downsweep} + f_{if-upsweep}}{2} = \frac{4V_r}{\lambda} \quad \text{Equation 6}$$

That is, when the intermediate frequency $f_{if-upsweep}$ at the time of the up-sweep depending on Equation 3 and the intermediate frequency $f_{if-downsweep}$ at the time of the down-sweep depending on Equation 4 are detected and the $f_b$ and the $f_d$ are derived from the $f_{if-upsweep}$ and the $f_{if-downsweep}$ depending on Equation 5 and Equation 6, since the frequency modulation bandwidth M, the modulation frequency $f_m$, and the wavelength $\lambda$ are preset values, the range R(m) and the relative velocity $V_r$ of the target may be obtained.

However, leakage signals from various paths, such as an antenna mismatch of the transmitted signal, an inter-antenna crosstalk, and a leakage on the substrate generate frequency components or DC components having a low intermediate frequency band like an actual target. The leakage noise signals in near field may not be separated from a target signal on a frequency, and since a size of the leakage noise signals is relatively larger than that of the reflected signal from the actual target, a detection blind zone in near field occurs, such that the range and/or the velocity of the target may not be measured within a very short range.

SUMMARY OF THE INVENTION

An embodiment of the present invention is directed to an apparatus and a method for detecting a target in near field capable of minimizing a phase noise and generating a wideband FMCW transmitting signal having excellent linearity while keeping coherence between transmitting and receiving frequencies.

Another embodiment of the present invention is directed to an apparatus and a method for detecting a target in near field capable of accurately measuring a range and/or a velocity of the target even within a very short range without a detection blind zone within a long field.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

To achieve the above problems, the embodiments of the present invention provides an apparatus for detecting a target in near field which minimizes a phase noise and generates a wideband FMCW transmitting signal having excellent linearity while keeping coherence between the transmitting and receiving frequencies.

In accordance with an embodiment of the present invention, an apparatus for detecting a target in near field, including: a transmitting and receiving antenna unit; a radio frequency (RF) transceiver configured to transmit a transmitting signal of a frequency modulated continuous wave (FMCW) generated by using a direct digital frequency synthesis scheme to a target through the antenna unit and perform time delay processing on a signal received by being reflected from the target as much as a preset time; an analog-to-digital converter configured to convert the received signal from the RF transceiver which is time delayed into digital information; a fast Fourier transform (FFT) processor configured to perform fast Fourier transform on the converted digital information; and a digital signal processing (DSP) unit configured to extract a range or a velocity of the target using the fast Fourier transformed information.

The RF transceiver may include: a direct digital frequency synthesizer (DDFS) configured to generate the transmitting signal of the FMCW by using a reference clock signal of a voltage controlled oscillator; and a delayer configured to process the time delay as much as the preset time.

As the delayer, any one of a bulk acoustic wave (BAW) delay element, a surface acoustic wave (SAW) filter, and a delay cable may be used.

The RF transceiver may include: a 3-way divider configured to transmit the transmitting signal of the FMCW from the DDFS; and a 3-way combiner configured to receive the received signal.

The up conversion and the down conversion may be performed by using the same local oscillation signal for frequency coherence between a transmitting path and a receiving path.

The 3-way divider and the 3-way combiner may be mounted in a waveguide.

The RF transceiver may be assembled in a monolithic microwave integrated circuit (MMIC) chip part.

The monolithic microwave integrated circuit (MMIC) chip part may be manufactured in a plurality of separate printed circuit boards (PCBs).

The apparatus for detecting a target in near field may further include: a plurality of gaskets configured to be mounted on the plurality of PCBs; and a housing configured to cover the plurality of PCBs.

The reference clock signal may be about 1 GHz.

A path for the up conversion may be provided with a power amplifier to amplify the transmitting signal and a local signal amplifier to amplify the local oscillation signal.

Both a reverse isolation characteristics of the power amplifier and a reverse isolation characteristics of the local signal amplifier may be used.

The power amplifier may be operated in a saturated state to minimize a change in an output level depending on flatness and temperature of the transmitted transmitting signal.

A path for the down conversion may be further provided with a variable amplifier to compensate for a gain change depending on a temperature of a receiving terminal.

The RF transceiver may include: a voltage controlled oscillator phase locked loop configured to perform phase locking by comparing a feed-backed signal of the voltage controlled oscillator with the transmitting signal from the DDFS; and a local oscillator phase locked loop configured to perform phase locking by comparing the reference clock signal and the feed-backed local oscillator signal.

An antenna leakage signal from the antenna may be used as a built in test (BIT) signal.

The delayer may be disposed after the down conversion.

The plurality of PCBs may be at least one of an analog substrate and an RF substrate.

In accordance with another embodiment of the present invention, a method for detecting a target in near field, including: generating a transmitting signal of an FMCW using a direct digital frequency synthesis scheme; transmitting the generated transmitting signal to the target through an antenna unit; receiving a received signal reflected from the target; performing time delay processing on the received signal as much as a preset time; converting the time delay processed received signal into digital information; performing a fast Fourier transform on the converted digital information; and extracting a range or a velocity of the target by using the fast Fourier transformed information.

DESCRIPTION OF SPECIFIC EMBODIMENTS

Figure 1:
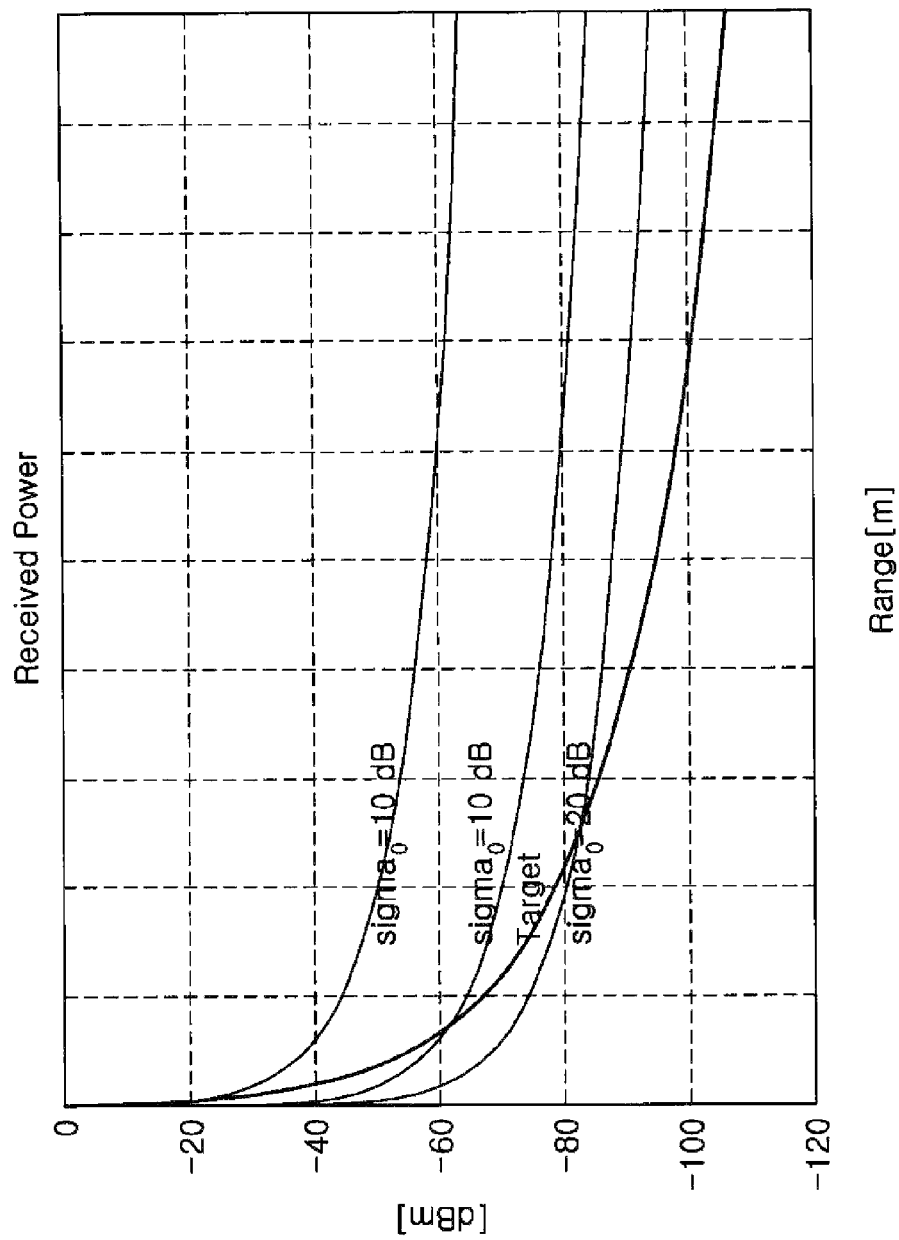
FIG. 1 is a graph illustrating general sea clutter received power vs. target received power.
Figure 2:
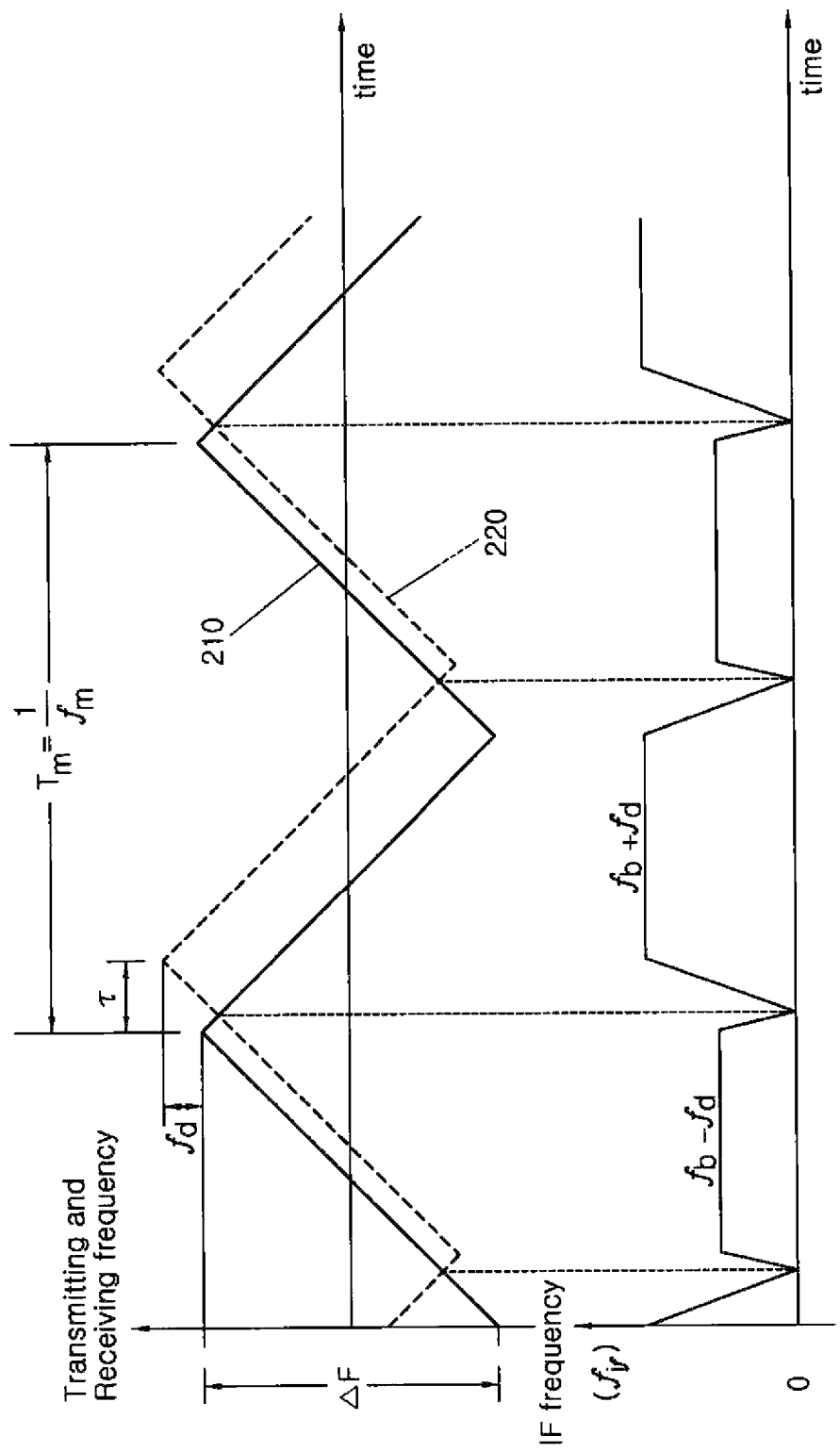
FIG. 2 is a waveform diagram of transmitted and received signals of a general frequency modulated continuous wave (FMCW) modulation scheme.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Since the present invention may be variously modified and have several exemplary embodiments, specific exemplary embodiments will be shown in the accompanying drawings and be described in detail in a detailed description. However, it is to be understood that the present invention is not limited to the specific exemplary embodiments, but includes all modifications, equivalents, and substitutions included in the spirit and the scope of the present invention.

Throughout the accompanying drawings, the same reference numerals will be used to describe the same components.

Terms used in the specification, 'first', 'second', etc., may be used to describe various components, but the components are not to be construed as being limited to the terms. The terms are used to distinguish one component from another component.

For example, the 'first' component may be named the 'second' component and the 'second' component may also be similarly named the 'first' component, without departing from the scope of the present invention. The term 'and/or' includes a combination of a plurality of items or any one of a plurality of terms.

Unless indicated otherwise, it is to be understood that all the terms used in the specification including technical and scientific terms has the same meaning as those that are understood by those who skilled in the art.

It must be understood that the terms defined by the dictionary are identical with the meanings within the context of the related art, and they should not be ideally or excessively formally defined unless the context clearly dictates otherwise.

Hereinafter, an apparatus and a method for detecting a target in near field in accordance with an embodiment of the present invention will be described in detail with reference to the accompanying drawings.

Figure 3:
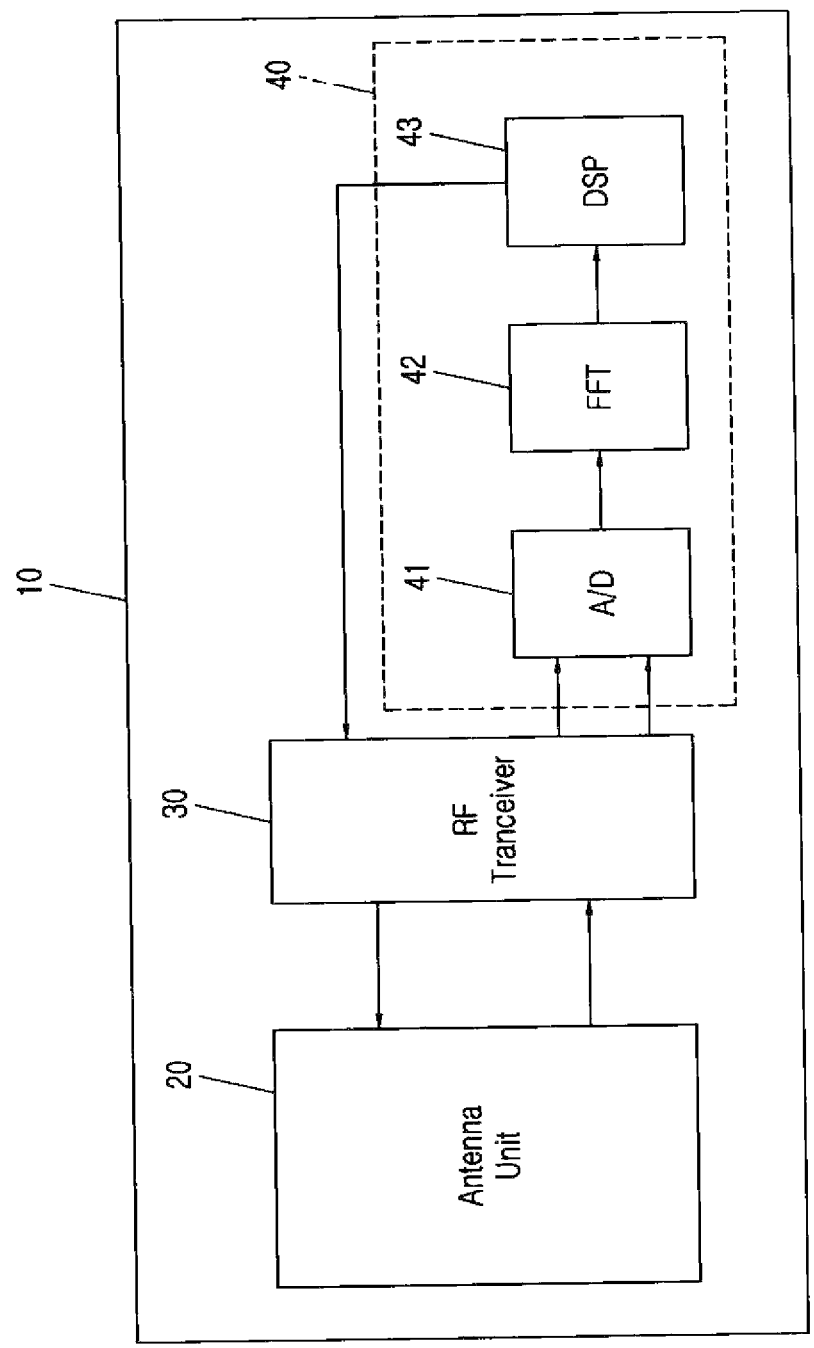
FIG. 3 is an overall configuration diagram of an apparatus for detecting a target in near field in accordance with an embodiment of the present invention.

FIG. 3 is a configuration diagram of an apparatus 10 for detecting a target in near field in accordance with an embodiment of the present invention. Referring to FIG. 3, the apparatus 10 for detecting a target in near field is configured to include an antenna unit 20, a radio frequency (RF) transceiver 30, and a signal processing unit 40.

In this configuration, the RF transceiver 30 receives a frequency modulation control signal from a digital signal processing (DSP) 43 and transmits a frequency modulated continuous wave to the antenna unit 20 and receives a signal received from the antenna unit 20.

Meanwhile, an analog output signal of the RF transceiver 30 is input to an analog/digital (A/D) converter 41 which extracts a distance and a velocity of a target and is converted into a digital data, which may pass through a fast Fourier transform (FFT) processor 42 and a digital signal processing (DSP) unit 43.

Figure 4:
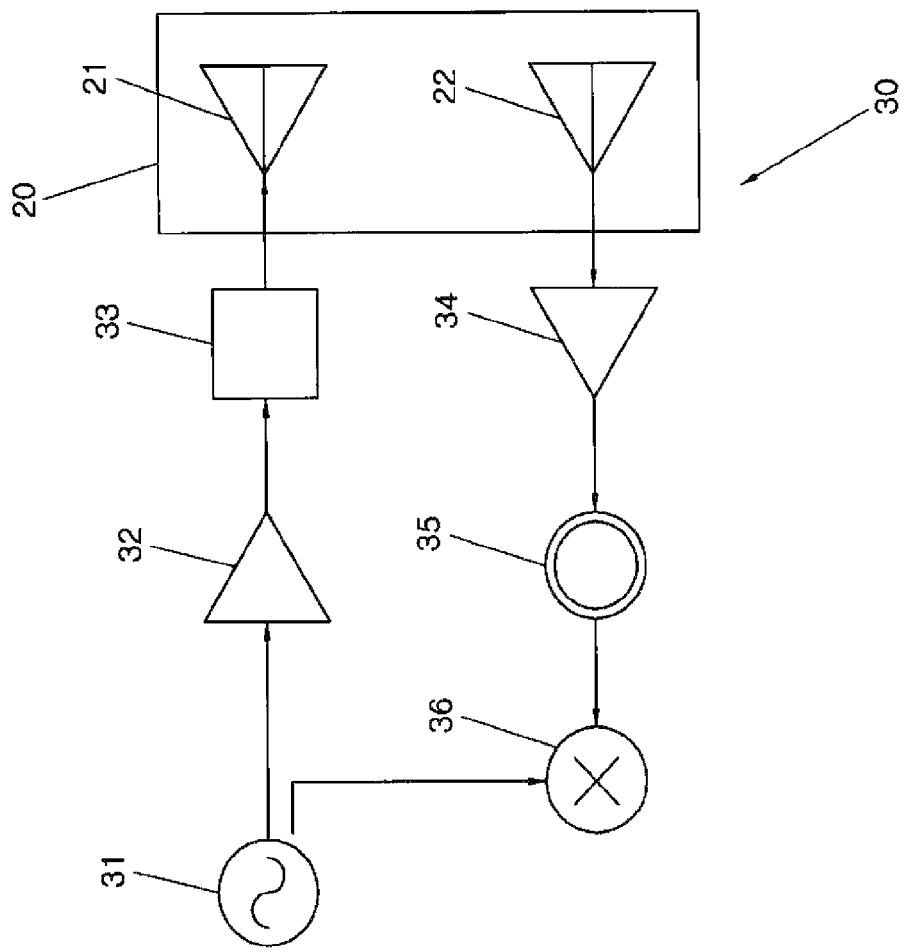
FIG. 4 is a block diagram of an RF transceiver illustrated in FIG. 3.

Next, the RF transceiver 30 illustrated in FIG. 3 will be described in more detail FIG. 4 is a block diagram of an RF transceiver illustrated in FIG. 3. Referring to FIG. 4, the RF transceiver 30 may be configured to include a voltage controlled oscillator 31, a power amplifier 32, a band pass filter 33, a low noise amplifier 34, a delayer 35, and a frequency mixer 36.

Hereinafter, the configuration will be described in detail. First, the voltage controlled oscillator 31 generates a frequency modulated continuous waveform, which is amplified by the power amplifier 32 and passes through the band pass filter 33 to suppress a frequency component out of a desired signal band and transmit and then is transmitted to a space through a transmitting antenna 21.

The signal reflected from the target is received by the receiving antenna 22, which is amplified by the low noise amplifier 34 and, also suppresses a noise figure of a receiving terminal. The received signal passing through the low noise amplifier 34 has time delayed by the delayer 35, which is applied to the frequency mixer 36 to obtain an intermediate frequency $f_{if}$ (Hz) represented by Equations 3 and 4 as an output of the frequency mixer 36.

Herein, as the delayer 35, a bulk acoustic wave (BAW) delay element, a surface acoustic wave (SAW) filter, a cable, or the like may be used, which may be selectively used depending on a delayed length.

A valid delay time of the delayer 35 is set to be $\tau_d$, and a valid range is set to be $R_{\tau_d}$, which may be represented by Equations 5 and 7. Consequently, the delayer 35 having the valid delay time of $\tau_d$ is used to add a frequency as much as $$\frac{2\Delta F f_m R_{\tau_d}}{C}$$

to the beat signal $f_b$ represented by Equation 7, thereby avoiding an effect of a leakage noise signal.

$$f_b = \frac{f_{if-upsweep} + f_{if-downsweep}}{2} = \quad \text{Equation 7}$$

$$\frac{4\Delta F f_m \left(R + \frac{R_{\tau_d}}{2}\right)}{C} = \frac{4\Delta F f_m R}{C} + \frac{2\Delta F f_m R_{\tau_d}}{C}$$

Figure 5:
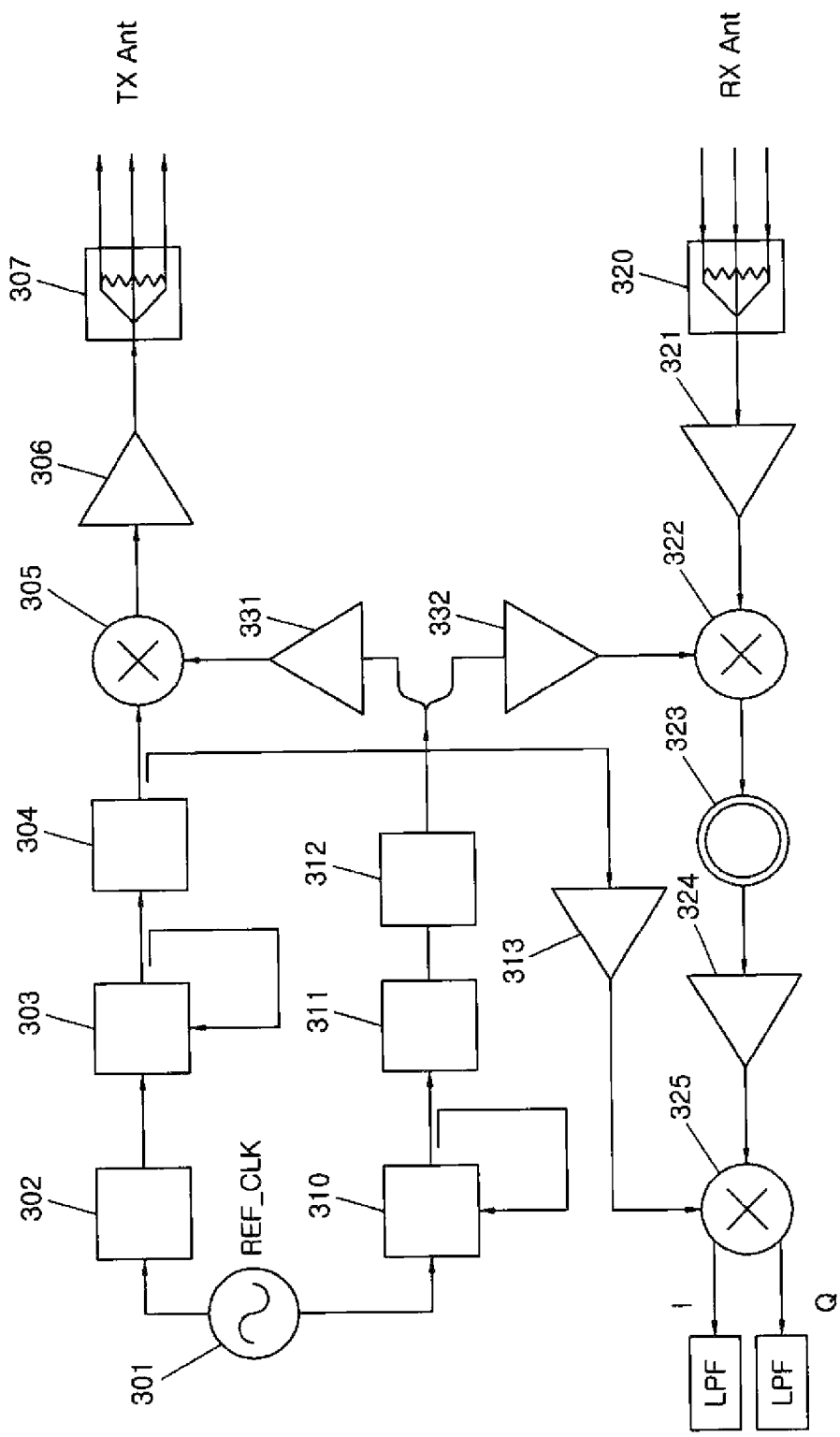
FIG. 5 is a detailed block diagram of the RF transceiver illustrated in FIG. 3.

In particular, the RF transceiver 30 illustrated in FIG. 3 will be described in more detail. FIG. 5 is a detailed block diagram of the RF transceiver illustrated in FIG. 3. Referring to FIG. 5, the RF transceiver 30 may be configured to include a reference clock signal 301, a direct digital frequency synthesizer (DDFS) 302, a voltage controlled oscillator phase locked loop 303, a low pass filter 304, an up frequency mixer 305, a primary power amplifier 306, a 3-way divider 307, a local oscillator phase locked loop 310, a multiplier 311, a local oscillator band pass filter 312, a first local signal amplifier 313, a 2-1-th local signal amplifier 331, a 2-2-th local signal amplifier 332, a 3-way combiner 320, a low noise amplifier 321, a down frequency mixer 322, a delay cable 323, a variable amplifier 324, and an I/Q frequency mixer 325. Hereinafter, the detailed configuration thereof will be described.

First, the frequency modulated continuous waveform is generated from the DDFS 302 receiving the reference clock signal 301. That is, the DDFS 302 uses a direct digital frequency synthesis scheme to generate the FMCW signal from the reference clock signal 301.

The voltage controlled oscillator phase locked loop 303 performs the phase locking by feed-backing the output of the voltage controlled oscillator and comparing a signal obtained by dividing a frequency of the output by $1/N_1$ with an input signal from the DDFS 302.

Herein, a frequency of the DDFS 302 is set to be $f_{DDS}$ and a frequency modulation width is set to be $\Delta f_{DDS}$, a frequency of the voltage controlled oscillator phase locked loop 303 becomes $N_1 \cdot f_{DDS}$, and the frequency modulation width becomes $N_1 \Delta f_{DDS}$.

Further, the output signal of the voltage controlled oscillator phase locked loop 303 passes through the low pass filter 304, such that harmonics of the output signal are removed. Therefore, the $N_1$ is approximately selected by using the reference clock signal 301, the DDFS 302, and the voltage controlled oscillator phase locked loop 303 to be able to limit a phase noise level of the output signal of the voltage controlled oscillator phase locked loop 303 to a low level and considerably widen the frequency modulation width.

Therefore, a wideband frequency modulation signal having low phase noise and an excellent linearity may be generated and thus sensitivity and range resolution of radar may be good.

The output of the low pass filter 304 is mixed with the local signal, which is amplified by the 2-1-th local signal amplifier 331, by the up frequency mixer 305, and thus the frequency of the output rises. The output is amplified by the power amplifier 306 and is transmitted to the transmitting antenna 21 through the 3-way divider 307. Further, the 3-way divider 307 may be further provided with the transmitting band pass filter to suppress the unwanted frequency signal.

Herein, the up frequency mixer 305 is used, such that the wideband frequency modulation signal having low phase noise and excellent linearity in a millimeter wave or more may be transmitted.

Further, the local oscillator phase locked loop 310 performs the phase locking by feed-backing the output of the local oscillator and comparing the output with the input from the reference clock signal 301. In this case, frequency coherence between the transmitted signal and the local oscillation signal may be obtained by using the same signal as the reference clock signal 301 used as the input signal of the DDFS 302.

Further, the output signal of the local oscillator phase locked loop 310 is multiplied by the multiplier 311 and the unwanted frequency signal is suppressed by the local oscillator band pass filter 312. The oscillation signal by the local oscillator band pass filter 312 is amplified to a level which is required for the local oscillation signals of the up frequency mixer 305 and the down frequency mixer 322 by the 2-1-th local signal amplifier 331 and the 2-2-th local signal amplifier 332, respectively.

Meanwhile, the weak signal received by being reflected from the target through the receiving antenna 22 is amplified by the low noise amplifier 321. Further, the band pass filter may be further provided to suppress the unwanted frequency signal from the received signal.

The output signal of the low noise amplifier 321 is applied to the down frequency mixer 322 and is mixed with the signal of the 2-2-th local signal amplifier 332 and then is down-converted. The output signal down-converted by the down frequency mixer 322 is time delayed through the delay cable 323 and is not affected by the leakage noise as described above.

In this case, in order to delay the wideband frequency modulation signal, the delay cable 323 having excellent time delay—wideband frequency characteristics is most appropriate and is disposed in a received path to be able to minimize the multiple reflection effect in the cable and is disposed after the down conversion to be able to reduce the cable cost.

Further, the output signal of the delay cable 323 is again amplified by the variable amplifier 324 and input to the I/Q frequency mixer 325. As the local oscillation signal input to the I/Q frequency mixer 325, the signal passing through the low pass filter 304 and the I/Q local signal amplifier 313 is used.

In particular, the output signal of the I/Q frequency mixer 325 becomes the intermediate frequency signal $f_f$(Hz) having a base band. In this case, as the local oscillation signal of the down frequency mixer 322 the same signal as the local oscillation signal of the up frequency mixer 305 is used and as the local oscillation signal of the I/Q frequency mixer 325 the signal branched from the low pass filter 304 is used.

That is, the effect on the phase noise of the transmitted signal may be minimized, the sensitivity of the FMCW radar may be good, and the Doppler information may be extracted, by keeping the frequency coherence between the transmitting path and the receiving path.

Further, REF_CLK of 1 GHz having the excellent phase noise characteristics as the reference clock signal 301 is used and thus the phase noise of the DDFS is minimized. Further, the FMCW modulation signal having x~x+2 GHz is locked to the DDS having the excellent phase noise by using a phase locked loop (PLL). The LO signal having yy GHz is generated by the PLL and the LO signal having yy GHz and the FMCW signal having x~x+2 GHz are mixed to generate the transmitted signal having (x+yy) to (x+2+yy) GHz. In this case, the phase noise of the transmitted signal is determined by the signal having a predominant phase noise level during the mixed process and therefore the phase noise of the LO signal having yy GHz is also optimized.

The 2-1-th local signal amplifier 331 is inserted into a path at the time of the up frequency conversion into the LO signal having yy GHz to use a reverse isolation characteristics of the 2-1-th local signal amplifier 331.

Further, the power amplifier 306 is operated in a saturated state. Therefore, the flatness of the wideband transmitted signal becomes good and the change in the output level depending on the temperature is minimized. Further, in order to compensate for the gain change depending on the temperature of the receiving terminal, the gain of the receiving terminal is controlled by a variable amplifier 324.

Further, the 3-way combiner 320 and/or the 3-way divider 307 for x pairs of transmitting and receiving antennas are designed to have a waveguide having an insertion loss relatively smaller than that of a flat type.

In addition, the range distance becomes good as well as a frequency spread of an antenna leakage signal and/or a frequency spread of a sea clutter beat signal is minimized, by applying the DDFS having excellent linearity.

Figure 6:
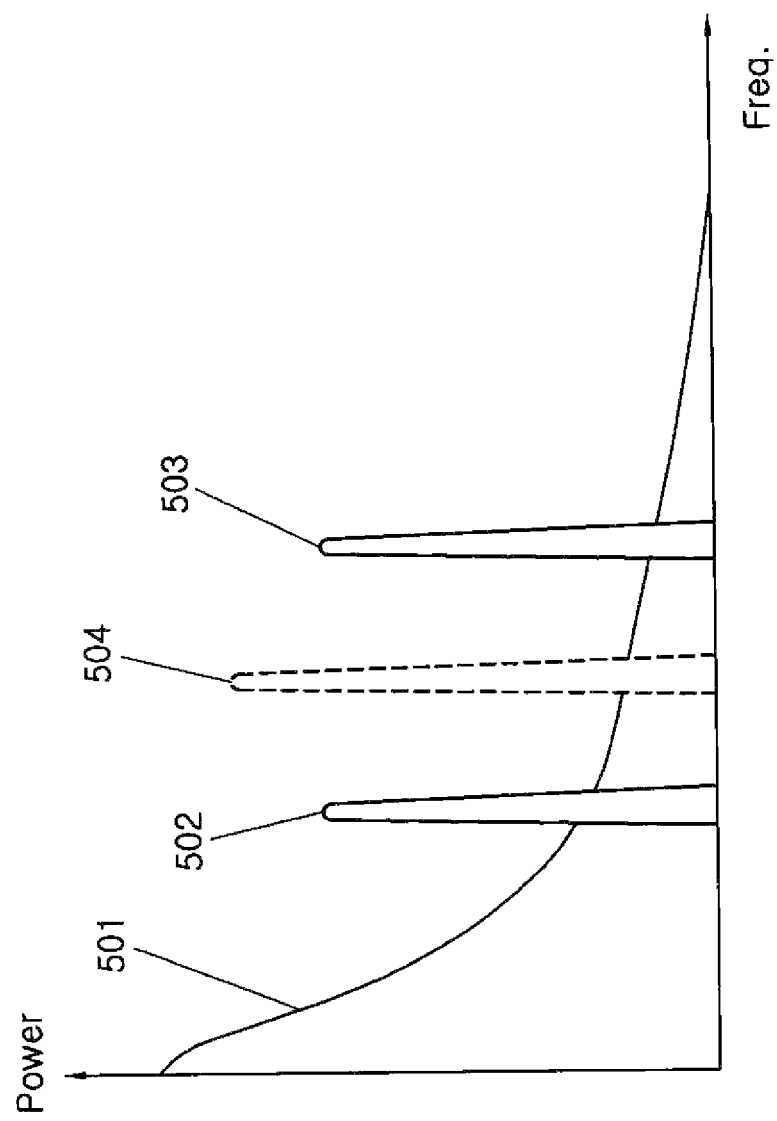
FIG. 6 is a general signal diagram of internal noise and an intermediate frequency of a target.

Next, FIG. 6 is a general signal diagram of the internal noise and the intermediate frequency of the target. Referring to FIG. 6, intermediate frequency signals 502 and 503 and an antenna leakage signal 504 overlap a base band noise 501, and thus the sensitivity becomes low.

Figure 7:
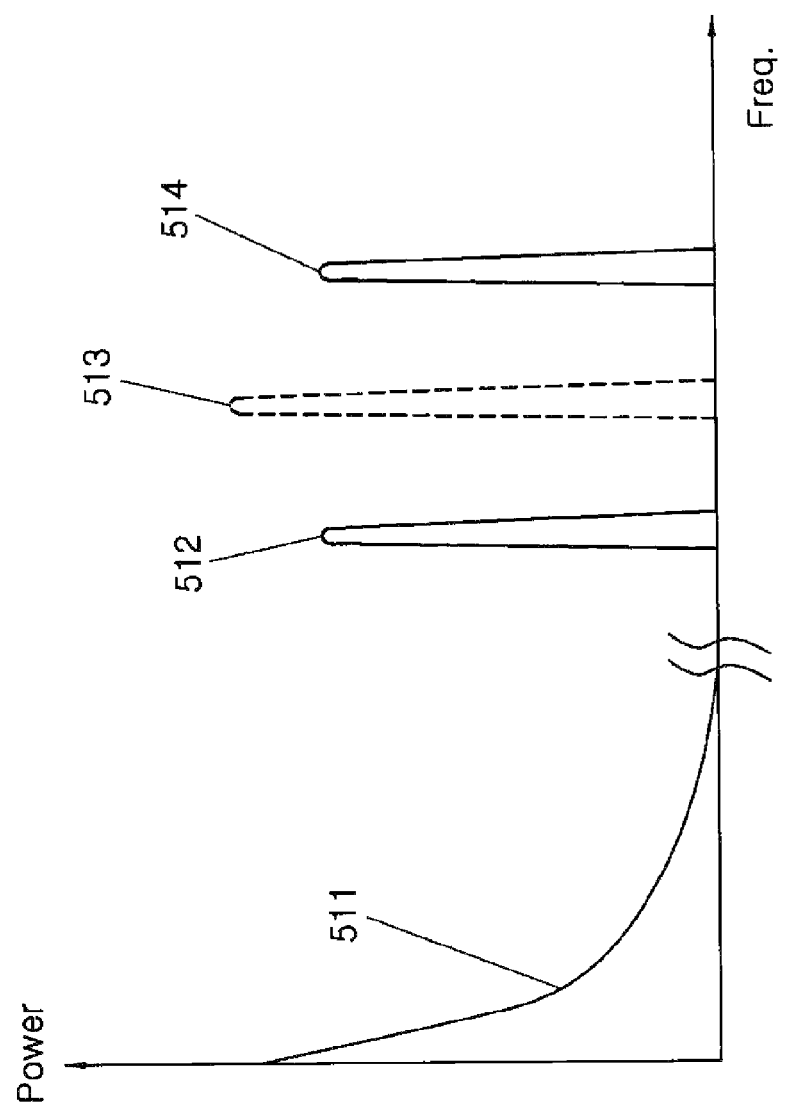
FIG. 7 is a signal diagram of the internal noise and the intermediate frequency of the target when a beat frequency offset in accordance with an embodiment of the present invention is present.

Next, FIG. 7 is a signal diagram of the internal noise and the intermediate frequency of the target when a beat frequency offset in accordance with an embodiment of the present invention is present. As illustrated in FIG. 7, it may be appreciated that a $f_{if\text{-}upsweep}$ signal 512 and a $f_{if\text{-}downsweep}$ signal 514 which are the intermediated frequency of the target is away from the internal noise 511. Further, it may be appreciated that the antenna leakage signal appears due to the coupling between the transmitting and receiving antennas. When the target moves in a specific range and a relative velocity, the $f_{if\text{-}upsweep}$ signal 512 and the antenna leakage signal 513 may overlap each other.

Generally, a level of the antenna leakage signal 513 is larger than that of the target signal, the isolation between the transmitting and receiving antennas should be designed to be good. Further, since the noise floor characteristics deteriorate due to the leakage signal by antenna or the long-range sea clutter signal having a relatively larger signal size, the phase noise of the transceiver should be minimized, and thus the target signal is designed not to be buried in a phase noise, of an antenna leakage signal.

Therefore, as illustrated in FIG. 7, the intermediate frequency signals 512 and 514 are out of the base band noise 511 and therefore it may be expected that the sensitivity is improved. Further, the antenna leakage signal 513 appropriately may be used as a built in test (BIT) and/or calibration signal of the FMCW radar.

Further, as the RF transceiver 30 illustrated in FIGS. 4 and 5 a monolithic microwave integrated circuit (MMIC) chip part which is configured of an analog PCB or an RF PCB is used. In other words, nine printed circuit boards (PCBs) in total may be manufactured separately. Further, a gasket is applied to each of the PCBs to cover a housing, thereby shielding each of the PCBs.

Figure 8:
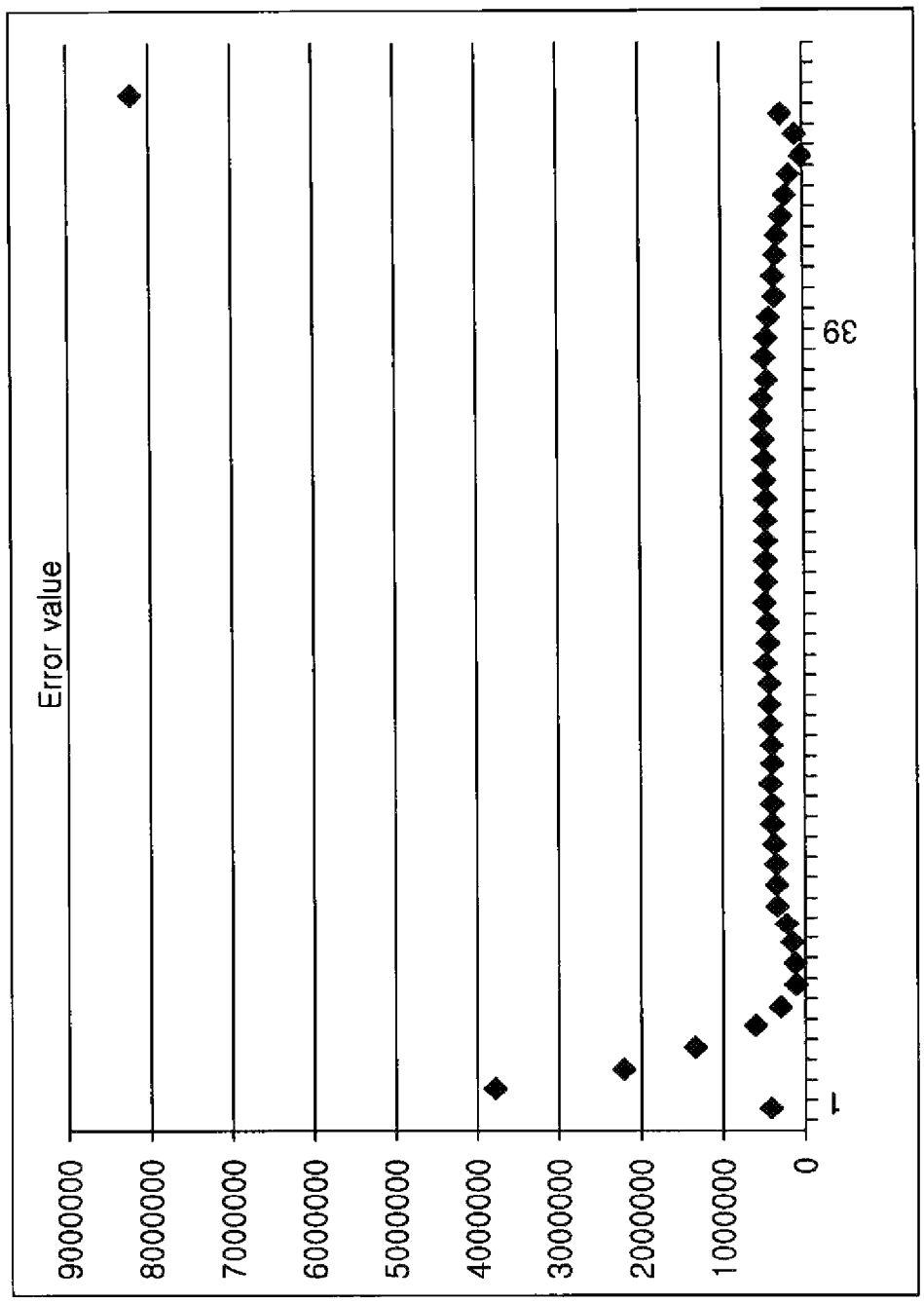
FIG. 8 is a graph illustrating a nonlinearity error value at the time of down sweep in accordance with an embodiment of the present invention.

FIG. 8 is a graph illustrating a nonlinearity error value at the time of down sweep in accordance with an embodiment of the present invention. Referring to FIG. 8, when calculating an error value, which is a difference between a measured value and an ideal value, by integral nonlinearity divided by the modulation bandwidth, the error value becomes about 0.4% or is within about 1 MHZ, except for a portion of an inflection point of the FMCW modulation signal.

Therefore, when performing the fast Fourier transform (FFT), except for the inflection point, the linearity of 0.05% (1 MHz/2 GHz) may be obtained.

In accordance with the embodiments of the present invention, the FMCW modulation scheme which has the relatively larger range rejection level, reduces the size and cost of the system, and easily acquires the additional information, such as the range from the target and the Doppler signal, may be used to remove the sea clutter out of the unwanted range, thereby reducing the phase noise and increasing the linearity.

Further, the transceiver is manufactured in the monolithic microwave integrated circuit (MMIC) chip, thereby satisfying all the requirements, such as the transmitted output and/or the gain of the receiving end.

While the present invention has been described with respect to the specific embodiments, it will be apparent to those skilled in the art that various changes and modifications may be made without departing from the spirit and scope of the invention as defined in the following claims.

What is claimed is:

1. An apparatus for detecting a target in near field, comprising:
   a transmitting and receiving antenna unit;
   a radio frequency (RF) transceiver configured to both up convert and down convert and transmit a transmitting signal of a frequency modulated continuous wave (FMCW) generated by using a direct digital frequency synthesis scheme to a target through the antenna unit and perform time delay processing on a signal received by being reflected from the target as much as a preset time to provide a beat frequency offset;
   an analog-to-digital (A/D) converter configured to convert the transmitted signal from the RF transceiver and the received signal which is time delayed into digital information;
   a fast Fourier transform (FFT) processor configured to perform fast Fourier transform on the converted digital information; and
   a digital signal processing (DSP) unit configured to extract a range or a velocity of the target using the fast Fourier transformed information,
   wherein a path for the up conversion is provided with a power amplifier to amplify the transmitting signal and a first local signal amplifier to amplify a local oscillation signal and provide the amplified local oscillation signal to an up frequency mixer, a path for the down conversion is provided with a second local signal amplifier to provide the amplified local oscillation signal to a down frequency mixer, and a reverse isolation apparatus including the first and second local signal amplifiers is used so that a leakage noise signal inside the RF transceiver appearing due to a mismatch of a plurality of TX antennas may be minimized, and the path for the down conversion is further provided with a variable amplifier to compensate for a gain change depending on a temperature of a receiving terminal, and
   wherein the RF transceiver comprises:
   a voltage controlled oscillator phase locked loop configured to perform phase locking by comparing a feed-backed voltage controlled oscillator signal with an input signal from a direct digital frequency synthesizer (DDFS);
   a local oscillator phase locked loop configured separately to perform phase locking by comparing a reference clock signal and a feed-backed local oscillator signal; and
   a multiplier configured to multiply a signal from the local oscillator phase locked loop.

2. The apparatus of claim 1, wherein the RF transceiver includes:
   the direct digital frequency synthesizer (DDFS) configured to generate the transmitting signal of the FMCW by using the reference clock signal; and
   a delayer configured to process the time delay as much as the preset time to generate the beat frequency offset.

3. The apparatus of claim 2, wherein as the delayer, any one of a bulk acoustic wave (BAW) delay element, a surface acoustic wave (SAW) filter, and a delay cable is used.

4. The apparatus of claim 2, wherein the RF transceiver includes:
   a 3-way divider configured to transmit the transmitting signal of the FMCW from the DDFS; and
   a 3-way combiner configured to receive the received signal.

5. The apparatus of claim 4, wherein the up conversion and the down conversion are performed by using the local oscillation signal for frequency coherence between a transmitting path and a receiving path.

6. The apparatus of claim 4, wherein the 3-way divider and the 3-way combiner are mounted in a waveguide.

7. The apparatus of claim 2, wherein the RF transceiver is assembled in a monolithic microwave integrated circuit (MMIC) chip part.

8. The apparatus of claim 7, wherein the monolithic microwave integrated circuit (MMIC) chip part is manufactured in a plurality of separate printed circuit boards (PCBs), wherein the plurality of separate printed circuit boards (PCBs) are shielded respectively.

9. The apparatus of claim 8, wherein the plurality of PCBs are at least one of an analog substrate and an RF substrate.

10. The apparatus of claim 2, wherein the reference clock signal is about 1 GHz.

11. The apparatus of claim 2, wherein the delayer is disposed after the down conversion.

12. The apparatus of claim 1, wherein the power amplifier is operated in a saturated state to minimize a change in an output level depending on flatness and temperature of the transmitted signal.

13. The apparatus of claim 1, wherein an antenna leakage signal from the antenna is used as a BIT (Built in Test) signal.

* * * * *